United States Patent
El-Khamy et al.

(10) Patent No.: US 10,193,570 B2
(45) Date of Patent: Jan. 29, 2019

(54) METHOD OF AND APPARATUS FOR GENERATING SPATIALLY-COUPLED LOW-DENSITY PARITY-CHECK CODE

(71) Applicant: Samsung Electronics Co., Ltd., Gyeonggi-do (KR)

(72) Inventors: Mostafa El-Khamy, San Diego, CA (US); Keke Liu, Davis, CA (US); Jungwon Lee, San Diego, CA (US); Inyup Kang, San Diego, CA (US)

(73) Assignee: Samsung Electronics Co., Ltd (KR)

( * ) Notice: Subject to any disclaimer, the term of this patent is extended or adjusted under 35 U.S.C. 154(b) by 435 days.

(21) Appl. No.: 14/517,181

(22) Filed: Oct. 17, 2014

(65) Prior Publication Data

US 2015/0155884 A1 Jun. 4, 2015

Related U.S. Application Data

(60) Provisional application No. 61/911,340, filed on Dec. 3, 2013.

(51) Int. Cl.
*H03M 13/11* (2006.01)
*H03M 13/03* (2006.01)
(Continued)

(52) U.S. Cl.
CPC ....... *H03M 13/116* (2013.01); *H03M 13/033* (2013.01); *H03M 13/1154* (2013.01);
(Continued)

(58) Field of Classification Search
CPC .......... H03M 13/116; H03M 13/1154; H03M 13/033; H03M 13/1102; H03M 13/23;
(Continued)

(56) References Cited

U.S. PATENT DOCUMENTS

| 7,499,490 B2 | 3/2009 | Divsalar et al. |
| 7,649,959 B2 | 1/2010 | Tirkkonen |

(Continued)

FOREIGN PATENT DOCUMENTS

WO WO2013047258 4/2013

OTHER PUBLICATIONS

Huang et al., Low-Density Arrays of Circulant Matrices Rank and Row-Redundancy Analysis, and Quasi-Cyclic LDPC codes, Feb. 3, 2012, School of Electronic and Information Engineering, Beihang University, Beijing 100083, China, and Department of Electrical and Computer Engineering, University of California, Davis, CA 95616, pp. 9, 10, 11, 29.*

(Continued)

*Primary Examiner* — April Y Blair
*Assistant Examiner* — Sazzad Hossain
(74) *Attorney, Agent, or Firm* — The Farrell Law Firm, P.C.

(57) ABSTRACT

A method, apparatus, and non-transitory computer-readable recording medium for generating an algebraic Spatially-Coupled Low-Density Parity-Check (SC LDPC) code are provided. The method includes selecting an LDPC block code over a finite field GF(q) with a girth of at least 6; constructing a parity-check matrix H from the selected LDPC block code; replicating H a user-definable number of times to form a two-dimensional array $H_{rep}$; constructing a masking matrix W with a user-definable spatially-coupled pattern; and masking a sub-matrix of $H_{rep}$ using W to obtain a spatially-coupled parity-check matrix $H_{SC}$, wherein a null space of $H_{SC}$ is the algebraic SC LDPC code.

30 Claims, 16 Drawing Sheets

(51) Int. Cl.
  *H04L 1/18* (2006.01)
  *H03M 13/25* (2006.01)
  *H03M 13/23* (2006.01)
  *H04L 1/00* (2006.01)

(52) U.S. Cl.
  CPC .... *H03M 13/1171* (2013.01); *H03M 13/1177* (2013.01); *H03M 13/1102* (2013.01); *H03M 13/1165* (2013.01); *H03M 13/1168* (2013.01); *H03M 13/23* (2013.01); *H03M 13/235* (2013.01); *H03M 13/255* (2013.01); *H04L 1/0057* (2013.01); *H04L 1/1812* (2013.01)

(58) Field of Classification Search
  CPC ............. H03M 13/255; H03M 13/235; H03M 13/1165; H03M 13/1171; H03M 13/1168; H03M 13/1177; H04L 1/0057; H04L 1/1812
  USPC ......................................... 714/752, 781, 786
  See application file for complete search history.

(56) References Cited

U.S. PATENT DOCUMENTS

| | | | |
|---|---|---|---|
| 8,499,218 B2 | 7/2013 | Yedldia et al. | |
| 2007/0067705 A1* | 3/2007 | Kim | G06F 11/1068 714/801 |
| 2008/0028271 A1* | 1/2008 | Chen | H03M 13/033 714/752 |
| 2008/0320363 A1* | 12/2008 | He | H03M 7/30 714/758 |
| 2009/0063930 A1* | 3/2009 | Matsumoto | H03M 13/1102 714/752 |
| 2010/0023838 A1 | 1/2010 | Shen et al. | |
| 2010/0211846 A1* | 8/2010 | Matsumoto | H03M 13/118 714/752 |
| 2010/0251062 A1 | 9/2010 | Chen et al. | |
| 2011/0119554 A1* | 5/2011 | Savin | H03M 13/1111 714/752 |
| 2011/0239075 A1* | 9/2011 | Xu | H03M 13/116 714/751 |
| 2012/0089888 A1* | 4/2012 | Li | H03M 13/036 714/752 |
| 2013/0044183 A1 | 2/2013 | Jeon et al. | |
| 2013/0086445 A1* | 4/2013 | Yedidia | H03M 13/1154 714/755 |
| 2013/0227372 A1 | 8/2013 | Uchikawa | |

OTHER PUBLICATIONS

J. Thorpe, Low-Density Parity-Check (LDPC) Codes Constructed from Protographs, IPN Progress Report 42-154, Aug. 15, 2003.

Quasi-Cyclic LDPC Codes, Department of Electrical & Computer Engineering University of California, Davis, Coding Group.

Arvind Sridharan et al., A Construction for Low Density Parity Check Convolutional Codes Based on Quasi-Cyclic Block Codes, University of Notre Dame, ISIT 2002 . . . .

R.M. Tanner, "On Graph Constructions for LDPC Codes by Quasi-Cyclic Extension," in Information, Coding and Mathematics (M. Blaum, P. Farrell, and H. van Tilborg, eds.) pp. 209.

Yu Kou et al., "On Circulant Low Density Parity Check Codes", IEEE International Symposium on Information Theory, Jun. 30-Jul. 5, p. 200, 2002.

O. Milenkovic, "Block-Circulant Low-Density Parity-Check Codes for Optical Communication System" IEEE Journal of Selected Topics in Quantum Electronics, pp. 294-299, Mar. 2004.

Shu Lin et al. Constructions of Nonbinary Quasi-Cyclic LDPC Codes: A Finite Field Approach, Department of Electrical & Computer Engineering, University of California, Davis.

Ali E. Pusane et al, Deriving Good LDPC Convolutional Codes from LDPC Block Codes.

* cited by examiner $$[3 \quad 3] \rightarrow \begin{bmatrix} 3 & 3 & & & & & & & & \\ & & 3 & 3 & & & & & & \\ & & & & 3 & 3 & & & & \\ & & & & & & 3 & 3 & & \\ & & & & & & & & 3 & 3 \end{bmatrix}$$

$$\downarrow$$

$$\begin{bmatrix} 1 & 1 & & & & & & & & \\ 1 & 1 & 1 & 1 & & & & & & \\ 1 & 1 & 1 & 1 & 1 & 1 & & & & \\ & & 1 & 1 & 1 & 1 & 1 & 1 & & \\ & & & & 1 & 1 & 1 & 1 & 1 & 1 \\ & & & & & & 1 & 1 & 1 & 1 \\ & & & & & & & & 1 & 1 \end{bmatrix}$$

FIG. 2 (PRIOR ART)

$$H = \begin{bmatrix} M_{0,0} & M_{0,1} & \cdots & M_{0,K-1} \\ M_{1,0} & M_{1,1} & \cdots & M_{1,K-1} \\ \vdots & \vdots & \ddots & \vdots \\ M_{J-1,0} & M_{J-1,1} & \cdots & M_{J-1,K-1} \end{bmatrix}$$

$$\begin{bmatrix} 0 & 0 & 1 & 1 & 1 & 0 & 1 & 1 & 1 & 0 \\ 0 & 1 & 1 & 1 & 0 & 1 & 0 & 0 & 1 & 1 \\ 1 & 1 & 1 & 0 & 0 & 1 & 1 & 1 & 0 & 0 \\ 1 & 0 & 0 & 1 & 1 & 0 & 0 & 1 & 1 & 1 \\ 1 & 1 & 0 & 0 & 1 & 1 & 1 & 0 & 0 & 1 \end{bmatrix}$$

m=3, c=1, n=5, b=2, m/c≠n/b

| 0,0 | 0,1 | 0,2 | 0,3 | 0,4 | 0,0 | 0,1 | 0,2 | 0,3 | 0,4 | 0,0 | 0,1 | 0,2 | 0,3 | 0,4 |
|-----|-----|-----|-----|-----|-----|-----|-----|-----|-----|-----|-----|-----|-----|-----|
| 1,0 | 1,1 | 1,2 | 1,3 | 1,4 | 1,0 | 1,1 | 1,2 | 1,3 | 1,4 | 1,0 | 1,1 | 1,2 | 1,3 | 1,4 |
| 2,0 | 2,1 | 2,2 | 2,3 | 2,4 | 2,0 | 2,1 | 2,2 | 2,3 | 2,4 | 2,0 | 2,1 | 2,2 | 2,3 | 2,4 |
| 0,0 | 0,1 | 0,2 | 0,3 | 0,4 | 0,0 | 0,1 | 0,2 | 0,3 | 0,4 | 0,0 | 0,1 | 0,2 | 0,3 | 0,4 |
| 1,0 | 1,1 | 1,2 | 1,3 | 1,4 | 1,0 | 1,1 | 1,2 | 1,3 | 1,4 | 1,0 | 1,1 | 1,2 | 1,3 | 1,4 |
| 2,0 | 2,1 | 2,2 | 2,3 | 2,4 | 2,0 | 2,1 | 2,2 | 2,3 | 2,4 | 2,0 | 2,1 | 2,2 | 2,3 | 2,4 |
| 0,0 | 0,1 | 0,2 | 0,3 | 0,4 | 0,0 | 0,1 | 0,2 | 0,3 | 0,4 | 0,0 | 0,1 | 0,2 | 0,3 | 0,4 |
| 1,0 | 1,1 | 1,2 | 1,3 | 1,4 | 1,0 | 1,1 | 1,2 | 1,3 | 1,4 | 1,0 | 1,1 | 1,2 | 1,3 | 1,4 |
| 2,0 | 2,1 | 2,2 | 2,3 | 2,4 | 2,0 | 2,1 | 2,2 | 2,3 | 2,4 | 2,0 | 2,1 | 2,2 | 2,3 | 2,4 |

FIG. 10 m=3, c=2, n=6, b=3, m/c≠n/b

| 0,0 | 0,1 | 0,2 | 0,3 | 0,4 | 0,5 | 0,0 | 0,1 | 0,2 | 0,3 | 0,4 | 0,5 |
|-----|-----|-----|-----|-----|-----|-----|-----|-----|-----|-----|-----|
| 1,0 | 1,1 | 1,2 | 1,3 | 1,4 | 1,5 | 1,0 | 1,1 | 1,2 | 1,3 | 1,4 | 1,5 |
| 2,0 | 2,1 | 2,2 | 2,3 | 2,4 | 2,5 | 2,0 | 2,1 | 2,2 | 2,3 | 2,4 | 2,5 |
| 0,0 | 0,1 | 0,2 | 0,3 | 0,4 | 0,5 | 0,0 | 0,1 | 0,2 | 0,3 | 0,4 | 0,5 |
| 1,0 | 1,1 | 1,2 | 1,3 | 1,4 | 1,5 | 1,0 | 1,1 | 1,2 | 1,3 | 1,4 | 1,5 |
| 2,0 | 2,1 | 2,2 | 2,3 | 2,4 | 2,5 | 2,0 | 2,1 | 2,2 | 2,3 | 2,4 | 2,5 |
| 0,0 | 0,1 | 0,2 | 0,3 | 0,4 | 0,5 | 0,0 | 0,1 | 0,2 | 0,3 | 0,4 | 0,5 |
| 1,0 | 1,1 | 1,2 | 1,3 | 1,4 | 1,5 | 1,0 | 1,1 | 1,2 | 1,3 | 1,4 | 1,5 |
| 2,0 | 2,1 | 2,2 | 2,3 | 2,4 | 2,5 | 2,0 | 2,1 | 2,2 | 2,3 | 2,4 | 2,5 |

FIG. 12

RATE=0.5:  (0,X,X,0,0,X,X,0)
RATE=0.6:  (0,X,X,0,X,X,X,0)
RATE=0.72: (0,X,X,0,X,X,X,0,0,X,X,X,X,X,X,0) — 1401

FIG. 14

METHOD OF AND APPARATUS FOR GENERATING SPATIALLY-COUPLED LOW-DENSITY PARITY-CHECK CODE

PRIORITY

This application claims priority under 35 U.S.C. § 119(a) to a U.S. Provisional patent application filed on Dec. 3, 2013 in the United States Patent and Trademark Office and assigned Ser. No. 61/911,340, the entire contents of which are incorporated herein by reference.

STATEMENT REGARDING FEDERALLY SPONSORED RESEARCH OR DEVELOPMENT

This invention was made with support from the U.S. Government under Grant CCF-1015548 awarded by the National Science Foundation. The U.S. Government has certain rights in this invention.

BACKGROUND OF THE INVENTION

1. Field of the Invention

The present invention relates generally to generating a Spatially-coupled Low-Density Parity-Check (SC LDPC) code, and more particularly, to generating an SC LDPC code whose Tanner graph is not required to be a graph cover of an underlying LDPC block code.

2. Description of the Related Art

Low-Density Parity-Check (LDPC) codes are a class of capacity-approaching linear block codes with iterative decoding. If GF(q) is a Galois field with order q, an LDPC code over GF(q) is a linear block code given by the null space of an m×n parity-check matrix H that has a low-density of the nonzero entries drawn from the field. As indicated in the definition, an LDPC code is fully specified by its parity-check matrix, and the constructions of LDPC codes are essentially the constructions of the parity-check matrices.

Based on the field over which the code is constructed, LDPC codes can be classified into two types: binary LDPC codes (i.e., q=2) and non-binary LDPC codes (i.e., q>2). Typically, non-binary LDPC codes show superiority over binary LDPC codes when the length of the code is moderate or short. Also, non-binary LDPC codes perform better than binary LDPC codes in the error-floor region. However, binary LDPC codes enjoy the merits of lower decoding complexity and capacity-achieving performance when the length of the code is long.

Spatially-Coupled Low-Density Parity-Check (SC LDPC) codes, originally known as LDPC convolutional codes, have received much attention due to their excellent thresholds. It has been proved that for the Binary Erasure Channel (BEC), the Maximum a posteriori Probability (MAP) threshold of a regular LDPC block ensemble can be approached by the Belief Propagation (BP) threshold of an ensemble generated by spatially coupling a collection of the original LDPC block ensembles. This is called the threshold saturation phenomenon. This phenomenon has been recently extended to general Binary Memoryless Symmetric (BMS) channels. Recently, the threshold saturation phenomenon of non-binary SC LDPC codes has also been reported for the BEC. A well-known general approach to construct the SC LDPC codes is to unwrap the parity-check matrix of an LDPC block code to obtain the parity-check (PC) matrix of an SC LDPC code, which is afterwards categorized into a graph-cover based construction.

If G is a ($d_v$, $d_c$) regular protograph, where $d_v$ and $d_c$ denote the variable node (VN) and check node (CN) degrees, respectively. A Tanner graph of a ($d_v$, $d_c$, L) SC LDPC code is obtained by spatially coupling a chain of L copies of G. FIG. 1 is an illustration of constructing an SC LDPC Tanner graph where $d_v$=3, $d_c$=6, and L=5 (i.e., a (3,6,5) SC LDPC Tanner graph) and FIG. 2 illustrates the corresponding matrix operations.

Typically, the process of spatial-coupling introduces extra parity-checks, which results in a rate loss compared with non-spatially-coupled block codes. A spatial-coupling pattern can usually be specified by four parameters (i.e., a, b, c, and L), where a and b denote the height (i.e., rows) and width (i.e., columns), respectively, of a matrix (i.e., a matrix which corresponds to a base protograph of the block code) to be spatially-coupled, c denotes a step-size, and L denotes a number of matrices to be spatially coupled. FIG. 3 is an illustration of a spatially-coupled matrix $B_{sc}$, where a=4, b=3, c=2, and L=4.

A special type of LDPC code which has received particular attention in practical applications is the type of Quasi-Cyclic LDPC (QC LDPC) code. A QC LDPC code is given by the null space of a sparse array of circulant matrices of the same size, as illustrated in FIG. 4, where 0≤i≤J, 0≤j≤K, and $M_{i,j}$ is an l×l circulant matrix.

QC LDPC codes have been chosen as the standard codes for various next generations of communication systems and are appearing in recent data storage products. A QC LDPC code is typically given by the null space of an array of sparse circulants of the same size over a finite field. Encoding of a QC LDPC code can be efficiently implemented with simple shift-registers. In a hardware implementation of an iterative decoder, the QC structure simplifies the wire routing and allows partially parallel decoding which offers a trade-off between decoding complexity and decoding speed. Moreover, extensive simulation results have shown well-designed QC LDPC codes can perform as well as, or better than, unstructured random LDPC codes. In most of the algebraic constructions of binary QC LDPC codes, the parity-check matrix of a code is an array of Circulant Permutation Matrices (CPMs) and/or Zero Matrices (ZMs) over GF(2).

The parity-check matrix of the LDPC block code H can be split into two parts then unwrapped to achieve a target length, to construct a spatially-coupled parity-check matrix from the above parity-check matrix of an LDPC block code. FIG. 5A is an illustration of splitting H.

FIG. 5B is an illustration of an LDPC convolution, or SC LDPC, code that results from unwrapping the parity-check matrix of FIG. 5A. The LDPC convolution, or SC LDPC, code, of FIG. 5B has the same rate and degree distribution as the LDPC block code from which it was constructed.

The following restrictions apply to conventional, prior art unwrapping techniques:

(1) a block code to be unwrapped must have the same rate as the design rate of the spatially-coupled code that results from the unwrapping; and (2) the spatially-coupled code that results from the unwrapping a block code has the same variable node and check node distributions as the block code; and (3) unwrapping of a block code with a parity-check matrix of size m×n requires that m/c=n/b, where b denotes the width of a matrix to be spatially-coupled, and where c denotes a step-size of the matrix. Thus, spatial-coupling patterns with values for m, n, b, and c that do not meet these criteria cannot be constructed using unwrapping; and (4) unwrapping of a block code with a parity-check matrix of size m×n will result in a spatially-coupled LDPC code with constraint length which is a multiple of n, and minimum periodicity of the time-varying pattern in the parity-check matrix which is a factor of m. Spatial coupling patterns with different constraint lengths and time varying periodicities cannot be constructed using unwrapping.

SUMMARY OF THE INVENTION

The present invention has been made to address the above-mentioned problems and disadvantages, and to provide at least the advantages described below. Accordingly, an aspect of the present invention provides a method of and apparatus for generating a Spatially-Coupled Low-Density Parity-Check (SC LDPC) code whose Tanner graph is not required to be a graph cover of an underlying LDPC block code.

In accordance with an aspect of the present invention, a method of generating an algebraic SC LDPC code is provided. The method includes selecting an LDPC block code over a finite field GF(q) with a girth of at least 6; constructing a parity-check matrix H from the selected LDPC block code; replicating H a user-definable number of times to form a two-dimensional array $H_{rep}$; constructing a masking matrix W with a user-definable spatially-coupled pattern; and masking a sub-matrix of $H_{rep}$ using W to obtain a spatially-coupled parity-check matrix $H_{SC}$, wherein a null space of $H_{SC}$ is the algebraic SC LDPC code.

In accordance with another aspect of the present invention, a method of generating an algebraic, binary SC QC LDPC code is provided. The method includes selecting an M×N base matrix B over a finite field GF(q), wherein every 2×2 sub-matrix of B contains at least one zero or is non-singular; applying a (q−1)-fold dispersion to B to obtain an M×N array $H_{QC}$ of (q−1)×(q−1) Circulant Permutation Matrices (CPMs) or Zero Matrices (ZMs) or a combination thereof, wherein a null space of $H_{QC}$ is a QC LDPC block code whose Tanner graph has a girth of at least 6; constructing a binary matrix $W_{QC}$ that is an SC array of (q−1)×(q−1) all-1 matrices or ZM matrices or a combination thereof that satisfies user-definable properties for girth and rate; and masking $H_{QC}$ using $W_{QC}$ to obtain a spatially-coupled quasi-cyclic parity-check matrix $H_{SC,QC}$, wherein the null space of $H_{SC,QC}$ is the algebraic, binary SC QC LDPC code.

In accordance with another aspect of the present invention, a method of generating an algebraic, binary SC QC LDPC code is provided. The method includes selecting an LDPC block code over a finite field GF(q); constructing a base matrix B from the selected LDPC block code, replicating B to form a two-dimensional semi-infinite array $B_{rep}$; constructing a masking matrix $W_{base}$ with a user-definable spatially-coupled pattern; masking a sub-matrix of $B_{rep}$ using $W_{base}$ to obtain a spatially-coupled parity-check matrix $B_{SC}$; and applying a (q−1)-fold dispersion to obtain a spatially-coupled quasi-cyclic parity-check matrix $H_{SC,QC}$, wherein the null space of $H_{SC,QC}$ is the algebraic, binary SC QC LDPC code.

In accordance with another aspect of the present invention, a method of generating an algebraic, non-binary SC QC LDPC code is provided. The method includes selecting an LDPC block code over a finite field GF(q); constructing a base matrix B from the selected LDPC block code; replicating B to form a two-dimensional semi-infinite array $B_{rep}$; constructing a masking matrix $W_{base}$ with a user-definable spatially-coupled pattern; masking a sub-matrix of $B_{rep}$ using $W_{base}$ to obtain a spatially-coupled parity-check matrix $B_{SC}$; applying a (q−1)-fold dispersion to obtain a spatially-coupled quasi-cyclic parity-check matrix $H_{SC,QC}$, wherein the null space of $H_{SC,QC}$ is the algebraic, binary SC QC LDPC code; and replacing entries of the binary SC QC LDPC to obtain the non-binary SC QC LDPC code.

In accordance with another aspect of the present invention, an apparatus for algebraic, SC LDPC code and transmitting a signal generated therefrom is provided. The apparatus includes an LDPC block code selector; a parity-check matrix generator; an array generator; a mask matrix generator; a masker and SC LDPC code generator; and a signal generator/transmitter.

In accordance with another aspect of the present invention, a non-transitory computer-readable recording medium is provided. The non-transitory computer-readable recording medium includes a program for generating an algebraic, binary, SC LDPC code, the program, when executed by a computer, causes the computer to perform a method. The method includes selecting an LDPC block code over a finite field GF(q) with a girth of at least 6; constructing a parity-check matrix H from the selected LDPC block code; replicating H a user-definable number of times to form a two-dimensional array $H_{rep}$; constructing a masking matrix W with a user-definable spatially-coupled pattern; and masking a sub-matrix of $H_{rep}$ using W to obtain a spatially-coupled parity-check matrix $H_{SC}$, wherein a null space of $H_{SC}$ is the algebraic, binary SC LDPC code.

BRIEF DESCRIPTION OF THE DRAWINGS

The above and other aspects, features, and advantages of the present invention will be more apparent from the following detailed description, taken in conjunction with the accompanying drawings, in which:

FIG. 2 is an illustration of a (3,6,5) Tanner graph for an SC LDPC;

FIG. 10 is an illustration of a parity-check matrix according to FIG. 9;

FIG. 12 is an illustration of a parity matrix according to FIG. 11;

FIG. 14 is an illustration of puncturing patterns;

DETAILED DESCRIPTION OF EMBODIMENTS OF THE PRESENT INVENTION

Figure 1:
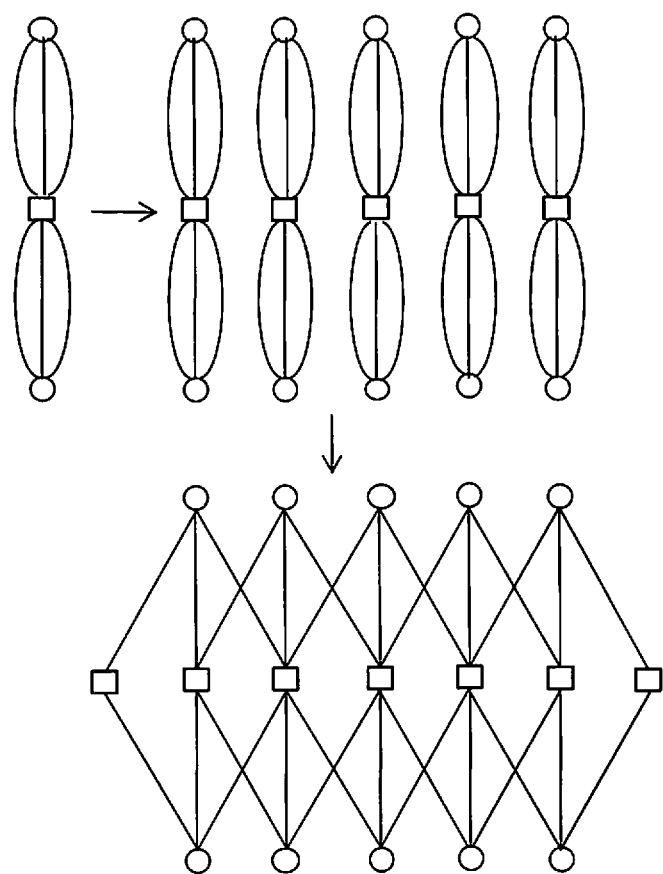
FIG. 1 is an illustration of a Tanner graph for an SC LDPC.
Figures 3, 4, 5A:
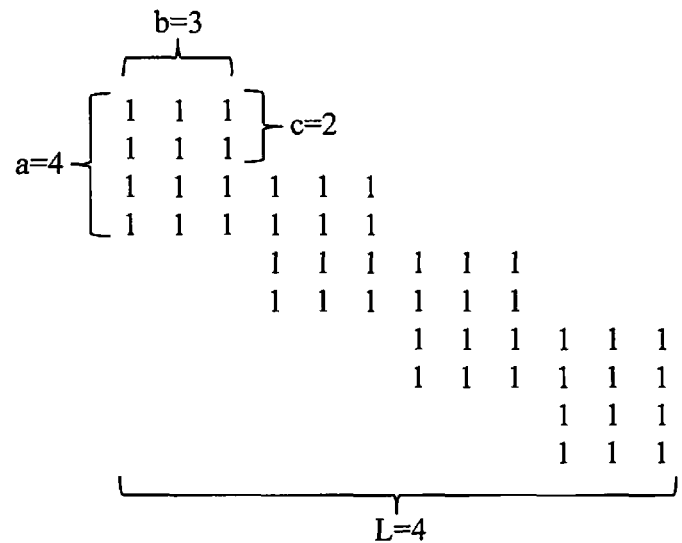
FIG. 3 is an illustration of an SC matrix.
FIG. 4 is an illustration of a quasi-cyclic parity-check matrix.
FIG. 5A is an illustration of splitting a matrix.
Figure 5B:
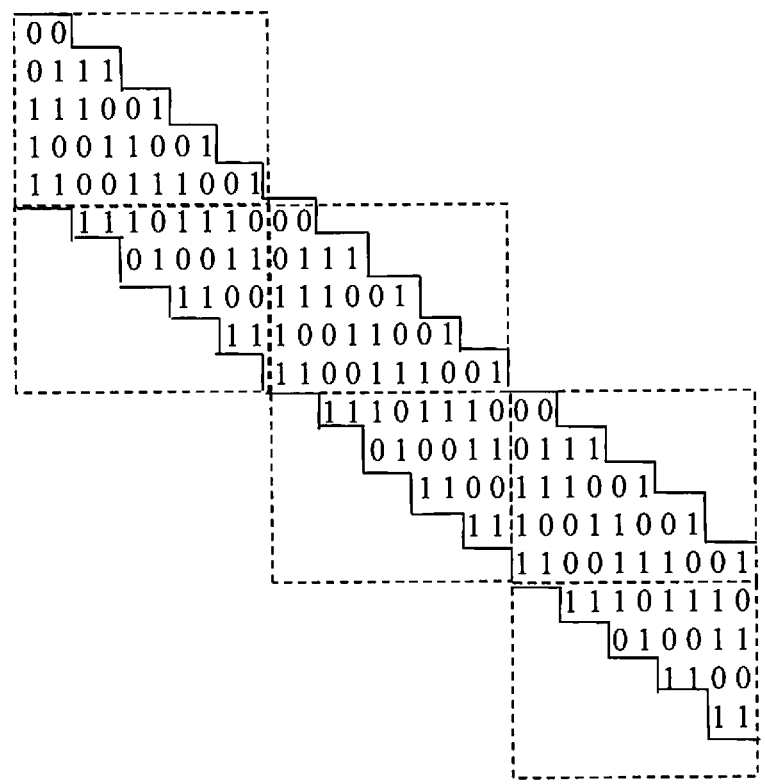
FIG. 5B is an illustration of unwrapping the split matrix of FIG. 5A.

Hereinafter, embodiments of the present invention are described in detail with reference to the accompanying drawings. In the following description, specific details such as detailed configurations and components are merely provided to assist the overall understanding of the embodiments of the present invention. Therefore, it should be apparent to those skilled in the art that various changes and modifications of the embodiments described herein may be made without departing from the scope and spirit of the present invention. In addition, descriptions of well-known functions and constructions are omitted for clarity and conciseness. The terms described below are terms defined in consideration of the functions in the present invention, and may be different according to users, intentions of the users, or customs. Therefore, the definitions of the terms should be determined based on the contents throughout the specification.

The present invention may have various modifications and various embodiments, among which embodiments will now be described in detail with reference to the accompanying drawings. However, it should be understood that the present invention is not limited to the embodiments, but the present invention includes all modifications, equivalents, and alternatives within the spirit and the scope of the present invention.

Although the terms including an ordinal number such as first, second, etc. may be used for describing various elements, the structural elements are not restricted by the terms. The terms are only used to distinguish one element from another element. For example, without departing from the scope of the present invention, a first structural element may be referred to as a second structural element. Similarly, the second structural element may also be referred to as the first structural element. As used herein, the term "and/or" includes any and all combinations of one or more associated items.

The terms used herein are merely used to describe specific embodiments and are not intended to limit the present invention. Singular forms are intended to include plural forms unless the context clearly indicates otherwise. In the description, it should be understood that the terms "include" or "have" indicate existence of a feature, a number, a step, an operation, a structural element, parts, or a combination thereof, and do not exclude the existence or probability of addition of one or more other features, numerals, steps, operations, structural elements, parts, or combinations thereof.

Unless defined differently, all terms used herein, which include technical terminologies or scientific terminologies, have the same meaning as that understood by a person skilled in the art to which the present invention belongs. Such terms as those defined in a generally used dictionary are to be interpreted to have meanings equal to the contextual meanings in the relevant field of art, and are not to be interpreted to have ideal or excessively formal meanings unless clearly defined in the present specification.

Although the following description of the embodiments of the present invention uses terms and names defined for LDPC, the present invention is not limited by these terms and names, and is identically applicable to other similar systems.

The present invention is a method of and apparatus for generating Spatially-Coupled Low-Density Parity-Check (SC LDPC) codes that overcome the restrictions of prior art unwrapping techniques described above. The method and apparatus generate algebraic SC LDPC codes that are binary or non-binary, regular or irregular, and robust to puncturing, which enables the present invention to provide rate-compatible SC LDPC codes suitable for mobile systems that support Hybrid Automatic Repeat reQuest (HARD) transmissions. While the prior art constructs SC LDPC codes that satisfy a girth requirement from a given LDPC block (i.e., the Tanner graph of the parity-check matrix of the resulting code is a graph-cover of the Tanner graph of the parity-check matrix of the underlying LDPC block code), the present invention does not require the Tanner graph of the resulting SC LDPC parity-check matrix to be a graph cover of the parity-check matrix of the underlying LDPC block code.

Figure 6:
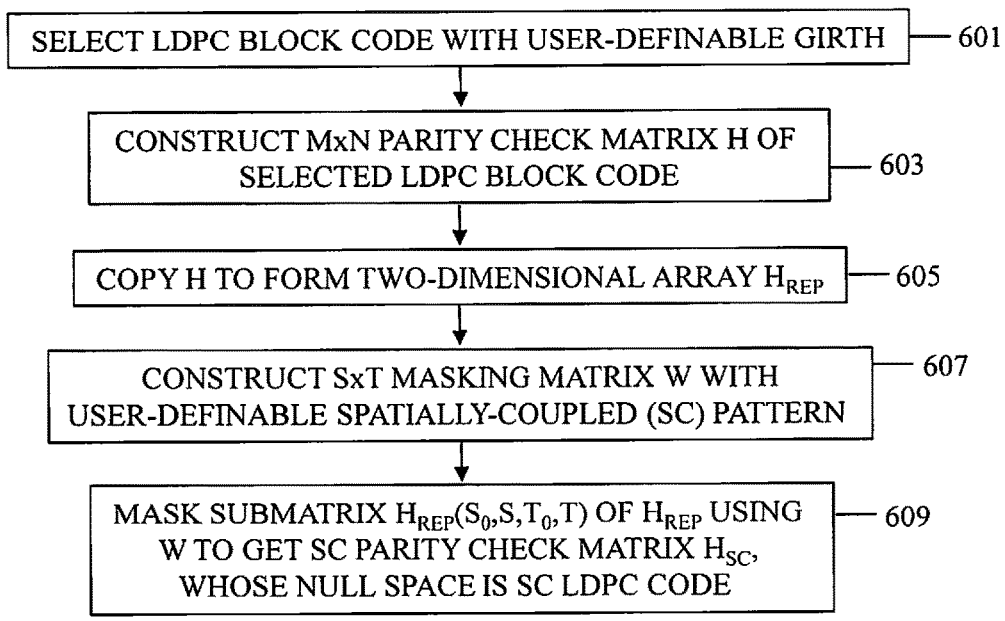
FIG. 6 is a flowchart for generating a SC LDPC code according to the present invention.

FIG. 6 is a flowchart for generating a SC LDPC code according to the present invention.

Referring to FIG. 6, in step 601, an LDPC block code over a finite field GF(q) with a girth of at least six is selected. The rate of the selected LDPC is not required to be equal to the design rate of the desired SC LDPC code resulting from the present invention.

In step 603, a parity-check matrix H whose Tanner graph has a girth of at least 6 is constructed from the selected LDPC block code. H may be an M×N matrix.

In step 605, H is replicated a user-definable number of times to form a two-dimensional array $H_{rep}$. A sub-matrix of $H_{rep}$, denoted by $H_{rep}(S_0,S,T_0,T)$, is obtained by taking an intersection of S consecutive rows of $H_{rep}$, starting from row $S_0$, and T consecutive columns, starting from column $T_0$. The present invention expands the parity-check matrix H.

In step 607, a masking matrix W is constructed with a user-definable spatially-coupled pattern. The parameters selected to design the masking matrix, or band-diagonal masking matrix, determines the rate and the SC pattern of the constructed SC LDPC code. The rate of the SC LDPC code resulting from the present invention is determined by the designed masking matrix, or band-diagonal masking matrix, rather than the selected LDPC block code.

In step 609, a sub-matrix of $H_{rep}$ is masked using W to obtain a spatially-coupled parity-check matrix $H_{SC}$, wherein a null space of $H_{SC}$ is the SC LDPC code. $H_{SC}$ is an entry-wise product, or Hadamard product, of $H_{rep}(S_0,S,T_0,T)$ and W. The resulting SC LDPC code is used to generate a signal, where the signal includes a HARQ signal. The generated signal may be transmitted via wireless, wired, or fiber-optic transmission.

The present invention can generate SC LDPC codes with different degree distributions from the corresponding selected LDPC block codes, and the Tanner graphs of the resulting SC LDPC codes are not required to be graph-covers of the Tanner graphs of the corresponding selected LDPC block codes as required by the prior art. In addition, the present invention can generate any spatial coupling pattern independent of the parameters of the base block code. Furthermore, generated SC LDPC codes are robust to puncturing, where the puncturing pattern may be regular for constructing rate-compatible codes for incremental redundancy Hybrid Automatic Repeat reQuest (HARQ), whereas prior art methods may not be robust to puncturing.

In an embodiment of the present invention, if the masking matrix $W=[w_{i,j}]_{0 \leq i < S, 0 \leq j < T}$ satisfies the following conditions:

for any $i_1$, $i_2$, $j_1$, $j_2$ with $0 \le i_1 < i_2 < S$, $0 \le j_1 < j_2 < T$ such that $w_{i_1,j_1} = w_{i_2,j_2} = w_{i_3,j_3} = w_{i_4,j_4} = 1$, $i_1 - i_2$ is not divisible by M and $j_1 - j_2$ is not divisible by N, the girth of $H_{SC}$ is at least 6.

In another embodiment of the present invention, if the masking matrix $W = [w_{i,j}]_{0 \le i < S, 0 \le j < T}$ satisfies the following conditions: for any $i_1$, $i_2$, $j$ with $0 \le i_1 < i_2 \le S, 0 \le j < T$ such that $w_{i_1,j} = w_{i_2,j} = 1$, $i_1 - i_2$ is not divisible by M, and for any $j_1$, $j_2$, $i$ with $0 \le j_1 < j_2 < T$, $0 \le i < S$ such that $w_{i,j_1} = w_{i,j_2} = 1$, $j_1 - j_2$ is not divisible by N, the girth of the Tanner graph of $H_{SC}$ is at least as large as the that of H.

Figure 7:
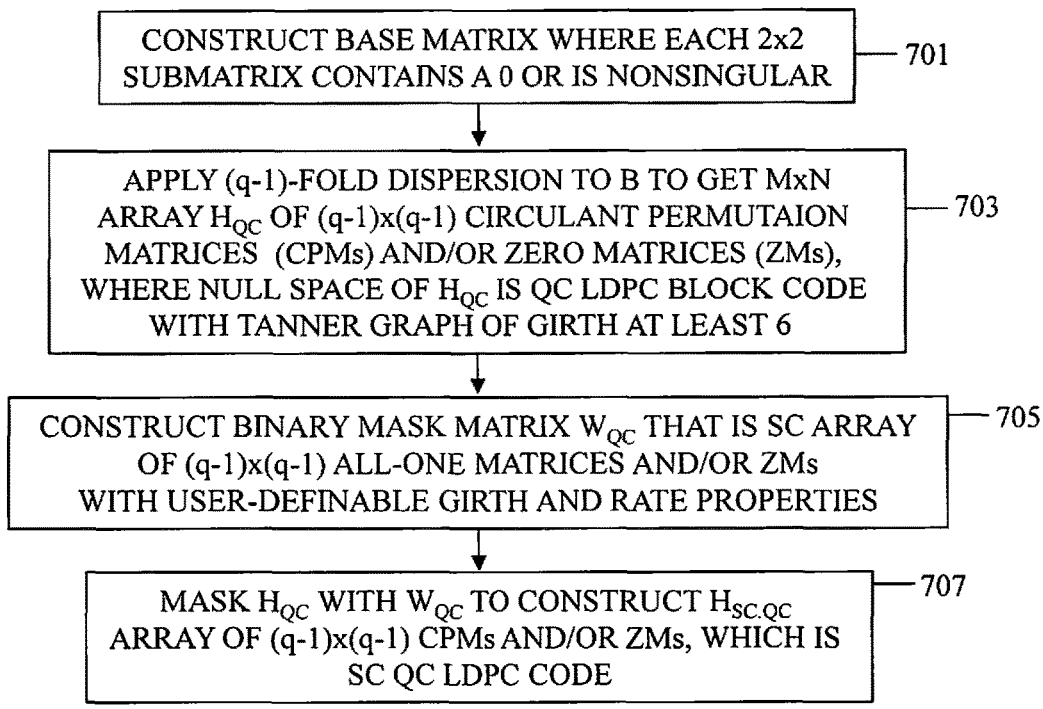
FIG. 7 is a flowchart for generating a binary SC QC LDPC code according to the present invention.

FIG. 7 is a flowchart for generating an algebraic, binary SC QC LDPC code according to the present invention.

Referring to FIG. 7, in step 701, an M×N base matrix B is selected over a finite field GF(q), wherein every 2 by 2 sub-matrix of B contains at least one zero or is non-singular.

In step 703, a (q–1)-fold dispersion is applied to B to obtain an M×N array $H_{QC}$ of (q–1)×(q–1) Circulant Permutation Matrices (CPMs) or Zero Matrices (ZMs) or a combination thereof, wherein a null space of $H_{QC}$ is a QC LDPC block code whose Tanner graph has a girth of at least 6.

In step 705, a binary matrix $W_{QC}$ is constructed that is an SC array of (q–1)×(q–1) all–1 matrices or ZM matrices or a combination thereof that satisfies user-definable properties for girth and rate.

In step 707, $H_{QC}$ is masked using $W_{QC}$ to obtain a spatially-coupled quasi-cyclic parity-check matrix $H_{SC,QC}$, wherein the null space of $H_{SC,QC}$ is the algebraic, binary SC QC LDPC code. The resulting SC QC LDPC code is used to generating a signal, where the signal includes a HARQ signal. The generated signal may be transmitted via wireless, wired, or fiber-optic transmission.

Figure 8:
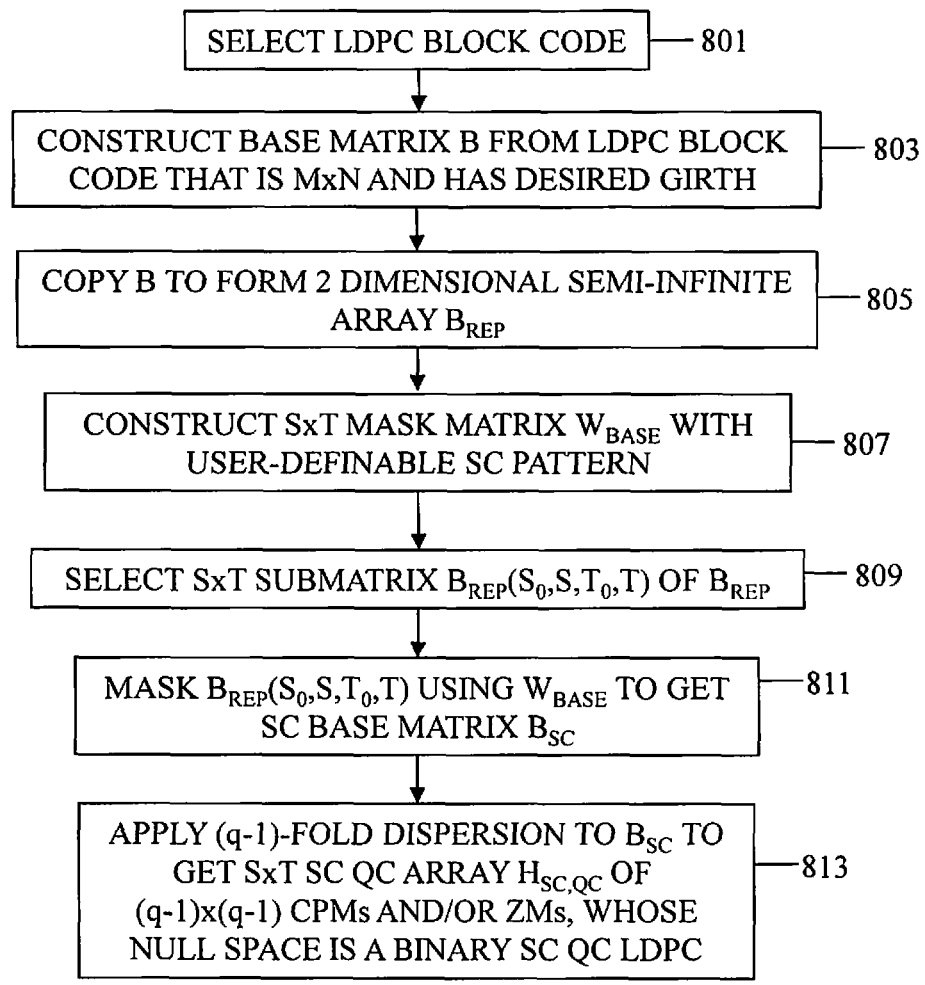
FIG. 8 is a flowchart for generating a binary SC QC LDPC code according to the present invention.

FIG. 8 is a flowchart of an alternate embodiment for generating an algebraic, binary SC QC LDPC code according to the present invention.

Referring to FIG. 8, in step 801, an LDPC block code is selected over a finite field GF(q).

In step 803, a base matrix B is constructed from the selected LDPC block code, wherein every 2×2 sub-matrix of B contains at least one zero or is non-singular. B may be an M×N matrix.

In step 805, B is replicated to form a two-dimensional semi-infinite array $B_{rep}$. $B_{rep}$ may be an S×T matrix.

In step 807, a masking matrix $W_{base}$ is constructed with a user-definable spatially-coupled pattern.

In step 809, a sub-matrix of $B_{rep}$ is selected. The submatrix of $B_{rep}$ is $B_{rep}(S_0, S, T_0, T)$, which is obtained by taking an intersection of S consecutive rows of $B_{rep}$ starting from row $S_0$ and T consecutive columns starting from column $T_0$.

In step 811, the sub-matrix of $B_{rep}$ is masked using $W_{base}$ to obtain a spatially-coupled base matrix $B_{SC}$.

In step 813, a (q–1)-fold dispersion is applied to $B_{SC}$ to obtain a spatially-coupled quasi-cyclic parity-check matrix $H_{SC,QC}$, wherein the null space of $H_{SC,QC}$ is the algebraic, binary SC QC LDPC code.

Figure 9:
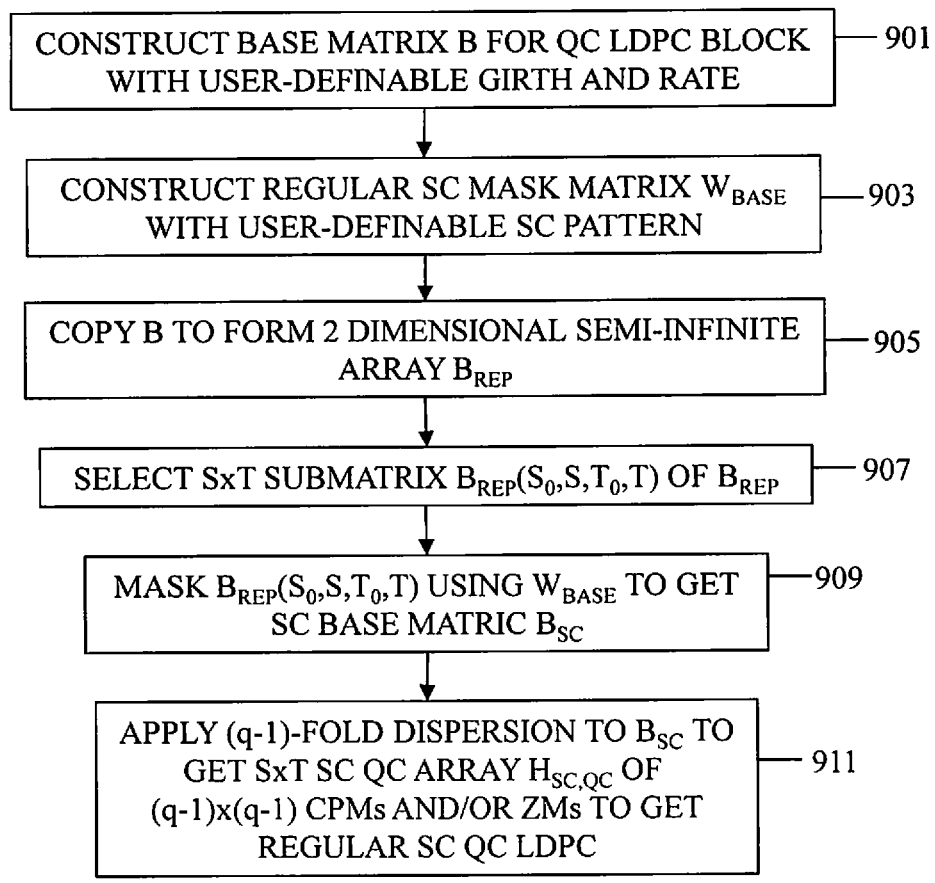
FIG. 9 is a flowchart for generating a regular, binary SC QC LDPC code according to the present invention.

FIG. 9 is a flowchart for generating a regular, binary SC QC LDPC code according to the present invention.

Referring to FIG. 9, in step 901, a base matrix B is constructed from an LDPC block code, wherein every 2×2 sub-matrix of B contains at least one zero or is non-singular. B may be an M×N matrix, and the LDPC block code is over a finite field GF(q).

In step 903, a masking matrix $W_{base}$ is constructed with a user-definable spatially-coupled pattern, where $W_{base}$ is i a regular SC masking matrix with a user-definable spatially-coupled pattern. $W_{base}$ may have L all–1 matrices of size a by b with a step size c, wherein s=cL+(a–c), t=bL, and an entry $W_{base_{i,j}}$ and $W_{base}$ is a 1 if $kc \le i < kc+a$ and $kb \le j < (k+1)b$ for $0 \le k < L$, and 0, otherwise, wherein (b–c)/b is a rate, (a–c)/bL is a rate loss due to edge effect, and bL(q–1) is a the length of the constructed SC QC LDPC code.

In step 905, B is replicated to form a two-dimensional semi-infinite array $B_{rep}$. $B_{rep}$ may be an S×T matrix.

In step 907, a sub-matrix of $B_{rep}$ is selected. The submatrix of $B_{rep}$ is $B_{rep}(S_0, S, T_0, T)$, which is obtained by taking an intersection of S consecutive rows of $B_{rep}$ starting from row $S_0$ and T consecutive columns starting from column $T_0$.

In step 909, the sub-matrix of $B_{rep}$ is masked using $W_{base}$ to obtain a spatially-coupled base matrix $B_{SC}$.

In step 911, a (q–1)-fold dispersion is applied to $B_{SC}$ to obtain a spatially-coupled quasi-cyclic parity-check matrix $H_{SC,QC}$, wherein the null space of $H_{SC,QC}$ is the algebraic, binary SC QC LDPC code.

In one embodiment, if the parameter a, b and c satisfies the following conditions:

$$a \le m, \left\lceil \frac{a-1}{c} \right\rceil b \le n,$$

the girth of the Tanner graph of $H_{SC,QC}$ is at least 6.

In another embodiment, if the parameter a, b and c satisfies the following conditions:

$$a \le m, \left\lceil \frac{a}{c} \right\rceil b \le n,$$

the girth of the Tanner graph of $H_{SC,QC}$ is at least as large as that of $H_{QC}$, which is the (q–1)-fold dispersion of B.

FIG. 10 is an illustration of a parity-check matrix according to FIG. 9, where m=3, c=1, n=5, b=2, and m/c≠n/b. The parity-check matrix of FIG. 10 cannot be achieved using prior art unwrapping methods, because of the restrictions of the prior art unwrapping methods described above.

Figure 11:
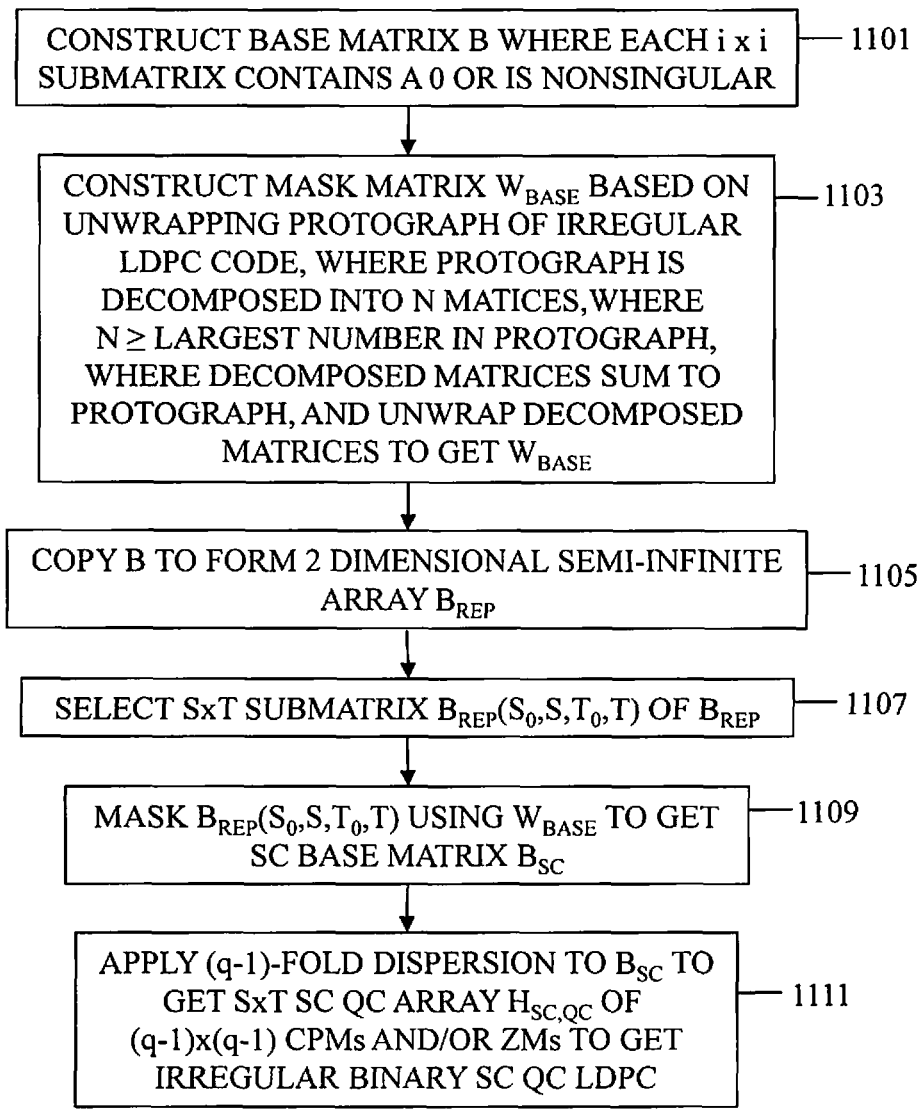
FIG. 11 is a flowchart for generating an irregular, binary SC QC LDPC code according to the present invention.

FIG. 11 is a flowchart for generating an irregular, binary SC QC LDPC code according to the present invention.

Referring to FIG. 11, in step 1101, a base matrix B is constructed from an LDPC block code over a finite field GF(q), wherein every 2×2 sub-matrix of B contains at least one zero or is non-singular. B may be an M×N matrix. The base matrix is not a regular LDPC code, but is an optimized protograph of an irregular LDPC code.

In step 1103, a masking matrix $W_{base}$ is constructed based on unwrapping a protograph of an irregular LDPC code, wherein the protograph is decomposed into n matrices, wherein n is greater than or equal to the largest number in the protograph, and the decomposed matrices sum to the protograph. If the protograph has multiple edges then it is decomposed so that its component matrices have either ones or zeros, (i.e., no multiple edges). To preserve the degree distribution, the unwrapping technique is used to construct the masking matrix. Equivalently, a staircase masking approach is applied to construct the masking matrix with parameters a, b, c, L from a semi-indefinite matrix, except the elements of the masking matrix are either the component matrices or a zero matrix of the same size, rather than being a simple 1 or 0.

In step 1105, B is replicated to form a two-dimensional semi-infinite array $B_{rep}$. $B_{rep}$ may be an S×T matrix.

In step 1107, a sub-matrix of $B_{rep}$ is selected. The submatrix of $B_{rep}$ is $B_{rep}(S_0, S, T_0, T)$, and is obtained by taking an intersection of S consecutive rows of $B_{rep}$, starting from row $S_0$, and T consecutive columns, starting from column $T_0$.

In step 1109, the sub-matrix of $B_{rep}$ is masked using $W_{base}$ to obtain a spatially-coupled base matrix $B_{SC}$ for an irregular LDPC code.

In step 1111, a (q−1)-fold dispersion is applied to $B_{SC}$ to obtain an S×T spatially-coupled quasi-cyclic parity-check matrix $H_{SC,QC}$, wherein the null space of $H_{SC,QC}$ is the algebraic, irregular, binary SC QC LDPC code. The S×T spatially-coupled quasi-cyclic parity-check matrix $H_{SC,QC}$ contains (q−1)×(q−1) Circulant Permutation Matrices (CPMs) and/or Zero Matrices (ZMs).

FIG. 12 is an illustration of a parity-check matrix according to FIG. 11, where m=3, c=2, n=6, b=3, and m/c≠n/b. The parity-check matrix of FIG. 12 cannot be achieved using prior art unwrapping methods, because of the restrictions of the prior art unwrapping methods described above.

Figure 13:
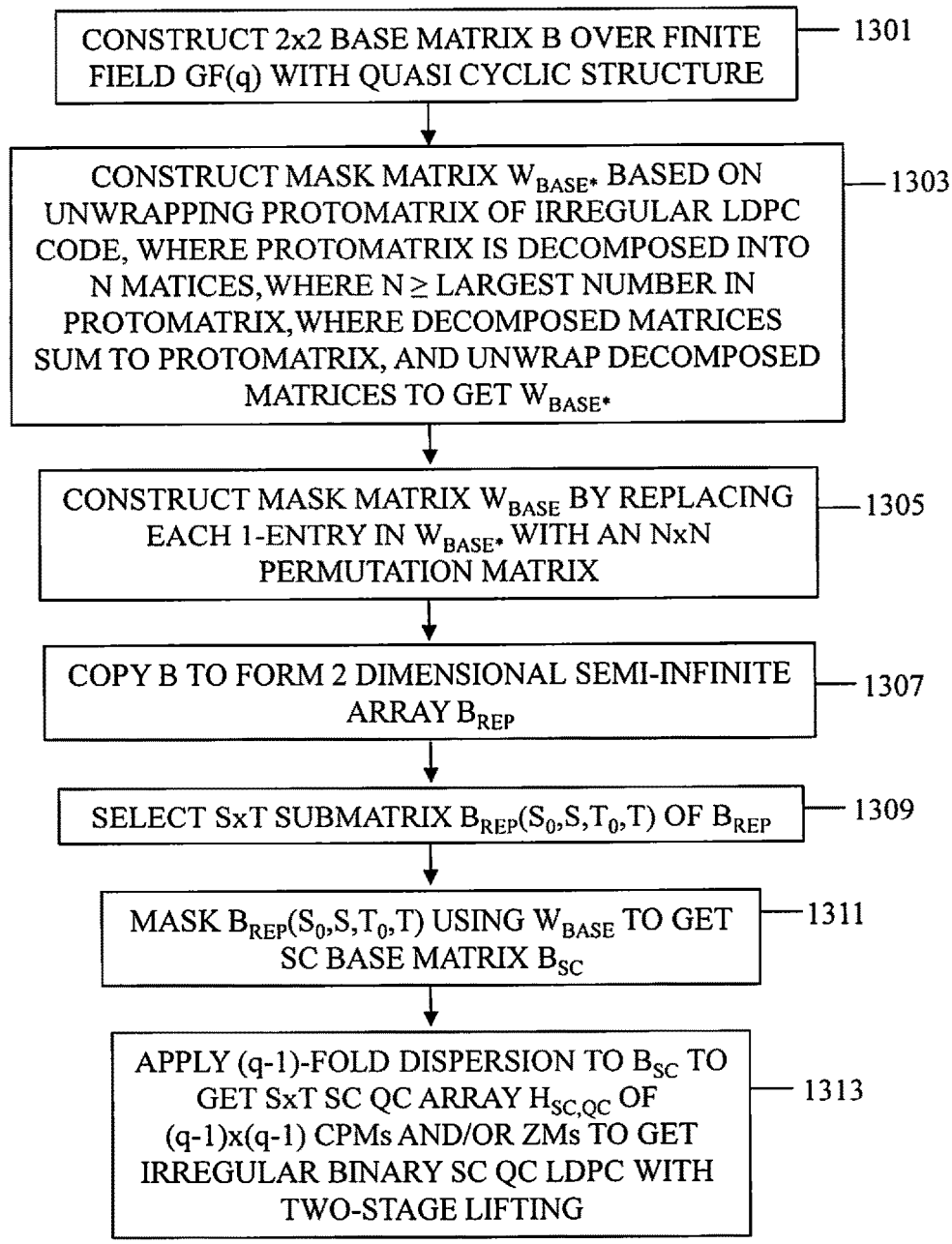
FIG. 13 is a flowchart for generating an irregular, binary SC QC LDPC code using two stage lifting according to the present invention.

FIG. 13 is a flowchart for generating an irregular, binary SC LDPC code according to the present invention, using two-stage lifting.

Referring to FIG. 13, in step 1301, a base matrix B is constructed from an LDPC block code over a finite field GF(q), wherein every 2×2 sub-matrix of B contains at least one zero or is non-singular. B may be an M×N matrix.

In step 1303, a masking matrix $W_{base*}$ is constructed based on unwrapping the protograph of an irregular LDPC code, wherein the protograph is decomposed into n matrices, and n is greater than or equal to the largest number in the protograph, and the decomposed matrices sum to the protograph. If the protograph of the irregular LDPC code has multiple edges, corresponding to entries in the protograph matrix which are greater than 1, then it is unwrapped so that the masking matrix has either ones or zeros.

In step 1305, a masking matrix $W_{base}$ is constructed by replacing each 1-entry in $W_{base*}$ with an N×N permutation matrix and designating the result $W_{base}$. The N×N permutation matrix may be chosen randomly.

In step 1307, B is replicated to form a two-dimensional semi-infinite array $B_{rep}$. $B_{rep}$ may be an S×T matrix.

In step 1309, a sub-matrix of $B_{rep}$ is selected. The sub-matrix of $B_{rep}$ is $B_{rep}(S_0,S,T_0,T)$, which is obtained by taking an intersection of S consecutive rows of $B_{rep}$, starting from row $S_0$, and T consecutive columns, starting from column $T_0$.

In step 1311, the sub-matrix of $B_{rep}$ is masked using $W_{base}$ to obtain a spatially-coupled base matrix $B_{SC}$. The $B_{SC}$ is an entry-wise product, or Hadamard product, of $B_{rep}(S_0,S,T_0,T)$ and $W_{base}$.

In step 1313, a (q−1)-fold dispersion is applied to $B_{SC}$ to obtain an S×T spatially-coupled quasi-cyclic parity-check matrix $H_{SC,QC}$, wherein the null space of $H_{SC,QC}$ is the algebraic, irregular, binary SC QC LDPC code, using two-stage lifting. The S×T spatially-coupled quasi-cyclic parity-check matrix $H_{SC,QC}$ contains (q−1)×(q−1) Circulant Permutation Matrices (CPMs) and/or Zero Matrices (ZMs).

FIG. 14 is an illustration of puncturing patterns.

Referring to FIG. 14, the irregular, binary SC QC LDPC code of FIG. 13 may be punctured to obtain rate-compatible irregular, binary SC QC LDPC codes suitable for generating a signal in accordance with the irregular, binary SC LDPC code, where the signal includes a HARQ signal. The resulting signal may then be transmitted via wireless, wired, or fiber-optic transmission. A puncture pattern with repetitive structure includes (0,X,X,0,0,X,X,0), (0,X,X,0,X,X,X,0), and (0,X,X,0,X,X,X,0,0,X,X,X,X,X,0), wherein "X" denotes a punctured variable node in a protograph.

Figure 15:
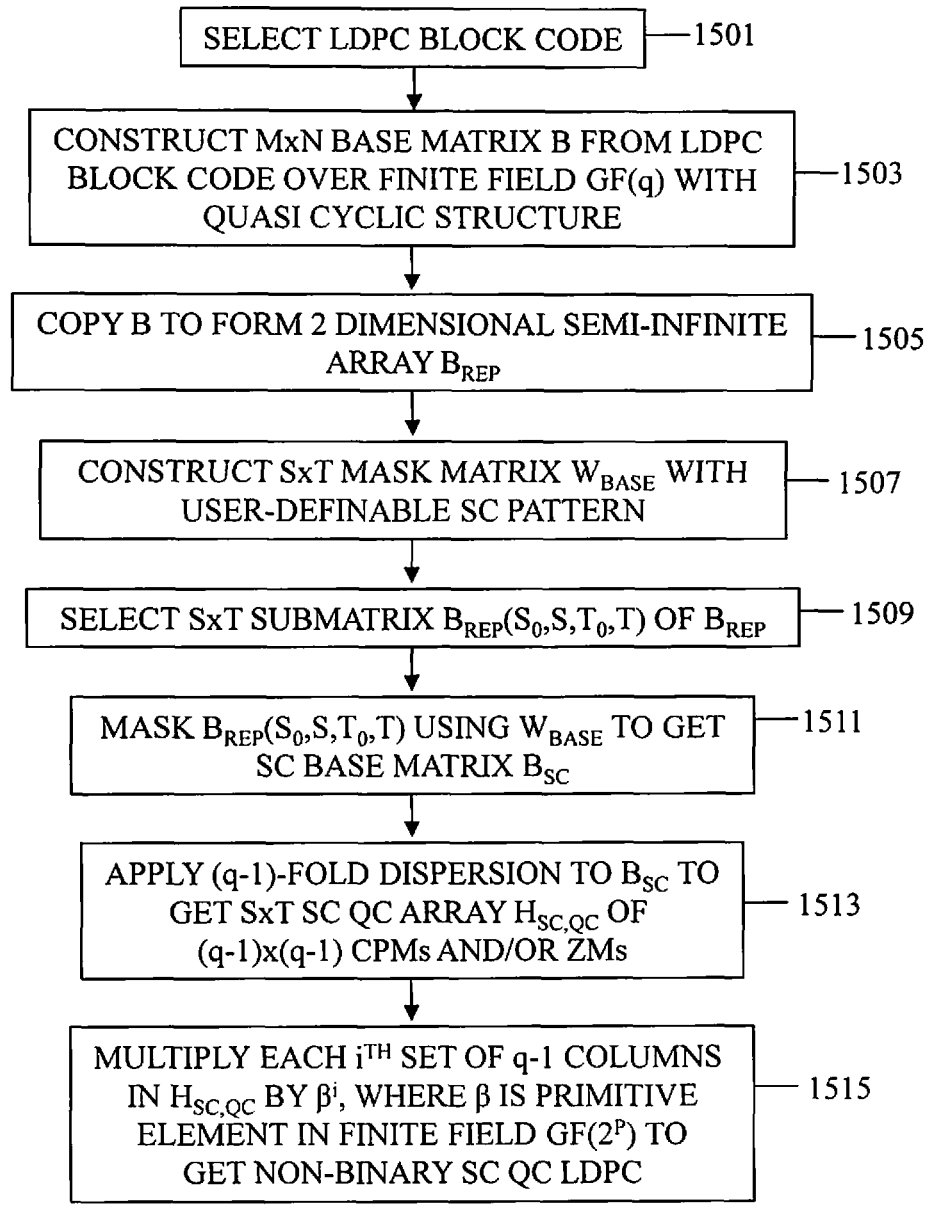
FIG. 15 is a flowchart for generating a regular, non-binary SC QC LDPC code according to the present invention.

FIG. 15 is a flowchart for generating a regular, non-binary SC QC LDPC code according to the present invention.

Referring to FIG. 15, in step 1501, an LDPC block code is selected over a finite field GF(q).

In step 1503, a base matrix B is constructed from the selected LDPC block code, wherein B may be an M×N matrix over finite field GF(q) with quasi-cyclic structure.

In step 1505, B is replicated to form a two-dimensional, semi-infinite array $B_{rep}$. $B_{rep}$ may be an S×T matrix.

In step 1507, a masking matrix $W_{base}$ is constructed with a user-definable spatially-coupled pattern.

In step 1509, a sub-matrix of $B_{rep}$ is selected, where the submatrix of $B_{rep}$ is $B_{rep}(S_0,S,T_0,T)$, which is obtained by taking an intersection of S consecutive rows of $B_{rep}$, starting from row $S_0$, and T consecutive columns, starting from column $T_0$.

In step 1511, the sub-matrix of $B_{rep}$ is masked using $W_{base}$ to obtain a spatially-coupled parity-check matrix $B_{SC}$, wherein $B_{SC}$ is an entry-wise product, or Hadamard product, of $B_{rep}(S_0,S,T_0,T)$ and $W_{base}$.

In step 1513, a (q−1)-fold dispersion is applied to obtain a spatially-coupled quasi-cyclic parity-check matrix $H_{SC,QC}$, wherein the null space of $H_{SC,QC}$ is the algebraic, binary SC QC LDPC code. The S×T spatially-coupled quasi-cyclic parity-check matrix $H_{SC,QC}$ contains (q−1)×(q−1) Circulant Permutation Matrices (CPMs) and/or Zero Matrices (ZMs).

In step 1515, entries of the binary SC QC LDPC are replaced to obtain the non-binary SC QC LDPC code. The entries of the binary SC QC LDPC may be replaced by multiplying each $i^{th}$ set of q−1 columns in $H_{SC,QC}$ by $\beta^i$, wherein $\beta$ is a primitive element in the finite field $GF(2^P)$.

Figure 16:
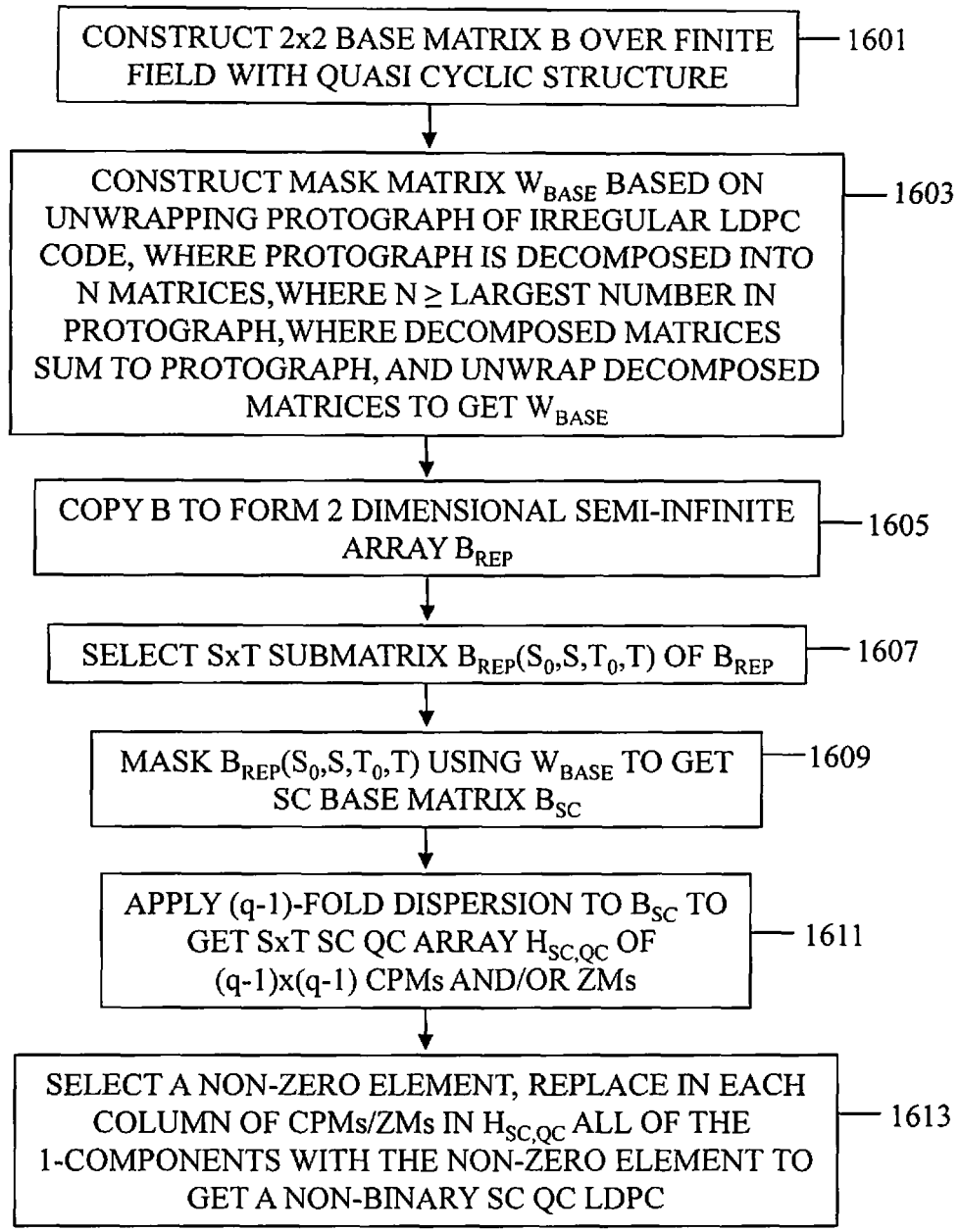
FIG. 16 is a flowchart for generating an irregular, non-binary SC QC LDPC code according to the present invention.

FIG. 16 is a flowchart for generating an irregular, non-binary SC QC LDPC code according to the present invention.

Referring to FIG. 16, in step 1601, a base matrix B is constructed from a selected LDPC block code, wherein B may be an M×N matrix over finite field GF(q) with quasi-cyclic structure.

In step 1603, a masking matrix $W_{base}$ is constructed based on unwrapping a protograph of an irregular LDPC code, wherein the protograph is decomposed into n matrices, wherein n is greater than or equal to the largest number in the protograph, and the decomposed matrices sum to the protograph matrix.

In step 1605, B is replicated to form a two-dimensional semi-infinite array $B_{rep}$. $B_{rep}$ may be an S×T matrix.

In step 1607, a sub-matrix of $B_{rep}$ is selected, where the submatrix of $B_{rep}$ is $B_{rep}(S_0,S,T_0,T)$ obtained by taking an intersection of S consecutive rows of $B_{rep}$, starting from row $S_0$, and T consecutive columns, starting from column $T_0$.

In step 1609, the sub-matrix of $B_{rep}$ is masked using $W_{base}$ to obtain a spatially-coupled parity-check matrix $B_{SC}$, wherein $B_{SC}$ is an entry-wise product, or Hadamard product, of $B_{rep}(S_0,S,T_0,T)$ and $W_{base}$.

In step 1611, a (q−1)-fold dispersion is applied to $B_{SC}$ to obtain a spatially-coupled quasi-cyclic parity-check matrix $H_{SC,QC}$. The S×T spatially-coupled quasi-cyclic parity-check matrix $H_{SC,QC}$ contains (q−1)×(q−1) Circulant Permutation Matrices (CPMs) and/or Zero Matrices (ZMs).

In step 1613, finite field elements is assigned to $H_{SC,QC}$ by, for each column of Circulant Permutation Matrices (CPMs) or Zero Matrices (ZMs) in $H_{SC,QC}$, replacing each 1-component in the column with a non-zero element selected from $GF(2^P)$. The non-zero element selected from $GF(2^P)$ may be a non-zero element selected randomly from $GF(2^P)$.

The irregular, non-binary SC QC LDPC code may be used to generate a signal, including a HARQ signal, and the signal may be transmitted via wireless, wired, or fiber-optic transmission.

Figure 17:
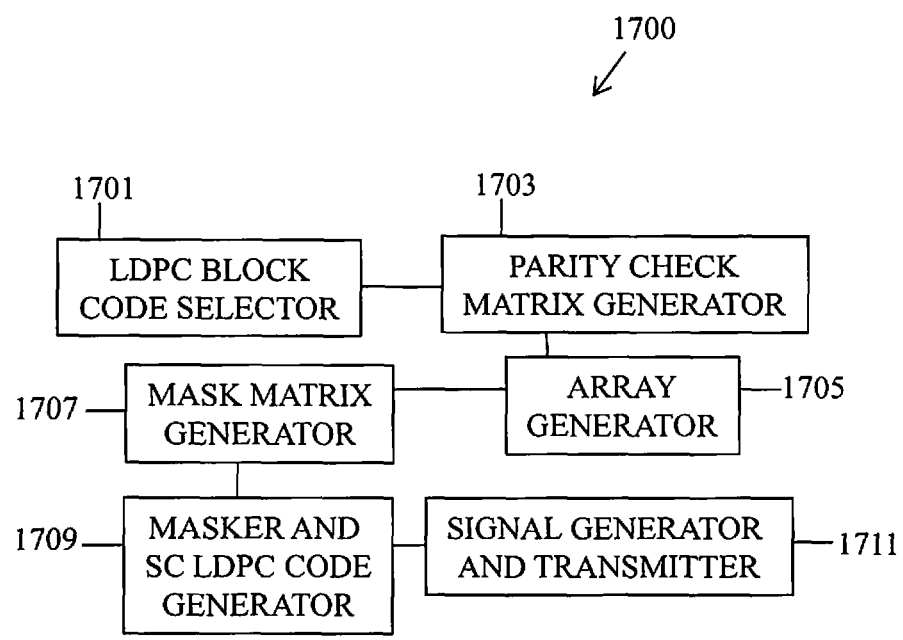
FIG. 17 is a schematic block diagram of an apparatus of the present invention.

FIG. 17 is a schematic block diagram of an apparatus 1700 of the present invention for generating an algebraic SC LDPC code and transmitting a signal generated therefrom.

Referring to FIG. 17, the apparatus 1700 includes an LDPC block code selector 1701, a parity-check matrix generator 1703, an array generator 1705, a mask matrix generator 1707, a masker and SC LDPC code generator 1709; and a signal generator/transmitter 1711. The apparatus 1700 may be configured to generate a binary SC LDPC code, a binary SC QC LDPC code, a regular SC QC LDPC code, an irregular SC QC LDPC code that is punctured for rate compatibility, a regular, non-binary SC QC LDPC code, and an irregular, non-binary SC QC LDPC code, as described above.

The present invention may also be implemented as computer readable codes in a non-transitory computer readable recording medium. The non-transitory computer readable recording medium is a data storage device for storing data read by a computer system. For example, the non-transitory computer readable recording medium includes a Read-Only Memory (ROM), a Random Access Memory (RAM), a Compact Disc (CD) ROM, a magnetic tape, a floppy disk, an optical data storage device, and a carrier wave (i.e., a transmission of data through the Internet). The non-transitory computer readable recording medium may be distributed through computer systems connected to a network, and thus, the computer readable code may be stored and executed in a distributed manner. Further, functional programs, codes, and code segments for establishing the present invention may easily be interpreted by programmers skilled in the art to which the present invention is applied.

Accordingly, the present invention includes a program including a code for implementing the apparatus and methods described in the appended claims of the specification and a non-transitory machine (a computer or the like)-readable storage medium for storing the program. Further, the program may be electronically transferred by a predetermined medium such as a communication signal transferred through a wired or wireless connection, and the present invention appropriately includes equivalents of the program.

A portable terminal according to the embodiments of the present invention may receive the program from a program providing device that is wiredly or wirelessly connected with the portable terminal, and may store the program. The program providing apparatus may include a program including instructions through which a graphic processing apparatus implements a preset content protection method, a memory for storing information or the like required for the content protecting method, a communication unit for performing wired or wireless communication with the graphic processing apparatus, and a controller for transmitting the corresponding program to a transceiver according to a request of the graphic processing apparatus or automatically.

Although embodiments of the present invention have been described in the detailed description of the present invention, the present invention may be modified in various forms without departing from the scope of the present invention. Thus the scope of the present invention shall not be determined merely based on the described embodiments, but rather determined based on the accompanying claims and the equivalents thereto.

What is claimed is:

1. A method of a mobile system that supports hybrid automatic repeat request (HARQ) transmission configured to construct a parity check matrix $H_{SC}$ of an algebraic Spatially-Coupled Low-Density Parity-Check (SC LDPC) code, comprising:
    constructing, by a parity-check matrix generator, a non-diagonal LDPC block code parity check matrix H with girth at least 6 by arranging preselected smaller matrices over a finite field GF(q), where q is an integer;
    replicating, by an array generator connected to an output of the parity check matrix generator, H a predetermined number of times to form a two-dimensional semi-infinite array $H_{rep}$;
    constructing, by a mask matrix generator connected to an output of the array generator, a band-diagonal masking matrix W with a predetermined spatially-coupled pattern based on selecting a step size c of a matrix of L matrices to be spatially coupled and one or more of a length a and a width b of the matrix of the L matrices, wherein the masking matrix W has a different rate than the LDPC block code, and wherein a, b, c, and L are integers;
    masking, by a masker and SC LDPC code generator connected to an output of the mask matrix generator, a sub-matrix of $H_{rep}$ using W to obtain the spatially-coupled parity-check matrix $H_{SC}$;
    generating a signal based on the spatially-coupled parity-check matrix $H_{SC}$; and
    transmitting the signal.

2. The method of claim 1, wherein H is an M×N matrix, where M and N are integers.

3. The method of claim 1, wherein $H_{rep}$ is an S×T matrix, and the sub-matrix of $H_{rep}$ is $H_{rep}(S_0,S,T_0,T)$, wherein $H_{rep}(S_0,S,T_0,T)$ is obtained by taking an intersection of S consecutive rows of $H_{rep}$, starting from row $S_0$, and T consecutive columns, starting from column $T_0$, where $S_0$, S, $T_0$, and T are integers.

4. The method of claim 1, wherein $H_{SC}$ is an entry-wise product of $H_{rep}(S_0,S,T_0,T)$ and W, where $S_0$, S, $T_0$, and T are integers.

5. The method of claim 1, further comprising:
    generating a signal in accordance with the SC LDPC code, where the signal includes a Hybrid Automatic Repeat reQuest (HARQ) signal, and
    transmitting the generated signal, by one of wireless, wired, and fiber-optic transmission.

6. A method of a mobile system that supports hybrid automatic repeat request (HARQ) transmission configured to generate an algebraic, binary Spatially-Coupled Quasi-Cyclic Low-Density Parity-Check (SC QC LDPC) code, comprising:
    constructing, by a parity-check matrix generator, an M×N base matrix B over a finite field GF(q), wherein every 2×2 sub-matrix of B contains at least one zero or is non-singular, where M, N, and q are integers;
    replicating, by an array generator connected to an output of the parity check matrix generator, a (q−1)-fold dispersion to B to obtain an M×N semi-infinite array $H_{QC}$ of (q−1)×(q−1) Circulant Permutation Matrices (CPMs) or Zero Matrices (ZMs) or a combination thereof, wherein a null space of $H_{QC}$ is a QC LDPC block code whose Tanner graph has a girth of at least 6;
    constructing, by a mask matrix generator connected to an output of the array generator, a binary band diagonal matrix $W_{QC}$ that is an SC array of (q−1)×(q−1) "all one" matrices or ZM matrices or a combination thereof that satisfies predetermined properties for girth and rate based on selecting a step size c of a matrix of L matrices to be spatially coupled and one or more of a length a and a width b of the matrix of the L matrices, wherein the binary matrix $W_{QC}$ has a different rate than the QC LDPC block code, and wherein a, b, c, and L are integers;

masking, by a masker and SC LDPC code generator connected to an output of the mask matrix generator, $H_{QC}$ using $W_{QC}$ to obtain a non-diagonal spatially-coupled quasi-cyclic parity-check matrix $H_{SC,QC}$;

generating a signal based on the spatially-coupled parity-check matrix $H_{SC}$; and transmitting the signal.

7. The method of claim 6, further comprising:

generating a signal in accordance with the SC QC LDPC code, where the signal includes a Hybrid Automatic Repeat reQuest (HARQ) signal; and transmitting the generated signal, by one of wireless, wired, and fiber-optic transmission.

8. A method of a mobile system that supports hybrid automatic repeat request (HARQ) transmission configured to generate an algebraic, binary Spatially-Coupled Quasi-Cyclic Low-Density Parity-Check (SC QC LDPC) code, comprising:

constructing, by an LDPC block code selector, an LDPC block code over a finite field GF(q), where q is an integer;

replicating, by a parity-check matrix generator connected to an output of the LDPC block code selector, a base matrix B from the selected LDPC block code, replicating B to form a two-dimensional semi-infinite array $B_{rep}$;

constructing, by a mask matrix generator connected to an output of the array generator, a band-diagonal masking matrix $W_{base}$ with a predetermined spatially-coupled pattern based on selecting a step size c of a matrix of L matrices to be spatially coupled and one or more of a length a and a width b of the matrix of the L matrices, wherein the masking matrix $W_{base}$ has a different rate than the LDPC block code, and wherein a, b, c, and L are integers;

masking, by a masker and SC LDPC code generator connected to an output of the mask matrix generator, a sub-matrix of $B_{rep}$ using $W_{base}$ to obtain a spatially-coupled parity-check matrix $B_{SC}$;

applying a (q−1)-fold dispersion to obtain a non-diagonal spatially-coupled quasi-cyclic parity-check matrix $H_{SC,QC}$;

generating a signal based on the spatially-coupled parity-check matrix $H_{SC}$; and transmitting the signal.

9. The method of claim 8, wherein B is an M×N matrix, where M, and N are integers.

10. The method of claim 8, wherein $B_{rep}$ is an S×T matrix, and the submatrix of $B_{rep}$ is $B_{rep}(S_0,S,T_0,T)$, wherein $B_{rep}(S_0,S,T_0,T)$ is obtained by taking an intersection of S consecutive rows of $B_{rep}$, starting from row $S_0$, and T consecutive columns, starting from column $T_0$, where $S_0$, S, $T_0$, and T are integers.

11. The method of claim 8, wherein $W_{base}$ is a regular SC masking matrix with a predetermined spatially-coupled pattern.

12. The method of claim 11, wherein $W_{base}$ has L "all one" matrices of size a×b with a step size c, wherein s=cL+(a−c), t=bL, and an entry $W_{base_{i,j}}$ of $W_{base}$ is a 1 if kc≤i<kc+a and kb≤j<(k+1)b for 0≤k<L, and 0, otherwise, wherein (b−c)/b is a rate, and (a−c)/bL is a rate loss due to edge effect, and wherein bL(q−1) is a length of the constructed SC QC LDPC code, where L, a, b, c, s, t, k, and l are integers.

13. The method of claim 8, wherein $W_{base}$ is based on unwrapping a protograph of an irregular LDPC code, wherein the protograph is decomposed into n matrices, wherein n is an integer greater than or equal to a largest number in the protograph matrix, the decomposed matrices sum to the protograph matrix, and unwrapping the decomposed matrices yields $W_{base}$ so that masking a sub-matrix of $B_{rep}$ using $W_{base}$ yields an irregular SC QC LDPC code.

14. The method of claim 13, wherein constructing $W_{base}$ comprises constructing a masking matrix $W_{base*}$ based on unwrapping a protograph of an irregular LDPC code, wherein the protograph is decomposed into n matrices, wherein n≥a largest number in the protograph matrix, the decomposed matrices sum to the protograph matrix, and unwrapping the decomposed matrices yields $W_{base*}$; and constructing the masking matrix $W_{base}$ by replacing each 1-entry in $W_{base*}$ with an N×N permutation matrix and designating the result $W_{base}$, where N is an integer.

15. The method of claim 14, wherein the N×N permutation matrix is chosen randomly.

16. The method of claim 14, further comprising puncturing the irregular SC QC LDPC code with a puncturing pattern to generate additional irregular SC QC LDPC codes with different rates.

17. The method of claim 16, wherein the puncture pattern has repetitive structure and comprises (0,X,X,0,0,X,X,0), (0,X,X,0,X,X,X,0), and (0,X,X,0,X,X,X,0,0,X,X,X,X,X,X,0), wherein "X" denotes a punctured variable node in a protograph.

18. The method of claim 8, wherein $B_{SC}$ is an entry-wise product of $B_{rep}(S_0,S,T_0,T)$ and $W_{base}$, where $S_0$, S, $T_0$, and T are integers.

19. The method of claim 8, further comprising generating a signal in accordance with the SC QC LDPC code, where the signal includes a Hybrid Automatic Repeat reQuest (HARD) signal, and transmitting the generated signal, by one of wireless, wired, and fiber-optic transmission.

20. A method of a mobile system that supports hybrid automatic repeat request (HARD) transmission configured to generate an algebraic, non-binary Spatially-Coupled Quasi-Cyclic Low-Density Parity-Check (SC QC LDPC) code, comprising:

constructing, by an LDPC block code selector, an LDPC block code over a finite field GF(q), where q is an integer;

constructing, by a matrix generator connected to an output of the LDPC block code selector, a base matrix B from the selected LDPC block code, replicating, by an array generator connected to an output of the parity check matrix generator, B to form a two-dimensional semi-infinite array $B_{rep}$;

constructing, by a mask matrix generator connected to an output of the array generator, a band-diagonal masking matrix $W_{base}$ with a predetermined spatially-coupled pattern based on selecting a step size c of a matrix of L matrices to be spatially coupled and one or more of a length a and a width b of the matrix of the L matrices, wherein the masking matrix $W_{base}$ has a different rate than the LDPC block code, and wherein a, b, c, and L are integers;

masking, by a masker and SC LDPC code generator connected to an output of the mask matrix generator, a sub-matrix of $B_{rep}$ using $W_{base}$ to obtain a spatially-coupled parity-check matrix $B_{SC}$;

applying a (q−1)-fold dispersion to obtain a non-diagonal spatially-coupled quasi-cyclic parity-check matrix $H_{SC,QC}$;

replacing entries of the binary SC QC LDPC to obtain the non-binary SC QC LDPC code;

generating a signal based on the spatially-coupled parity-check matrix $H_{SC}$; and transmitting the signal.

21. The method of claim 20, wherein B is an M×N matrix, where M and N are integers.

22. The method of claim 20, wherein $B_{rep}$ is an S×T matrix, and the submatrix of $B_{rep}$ is $B_{rep}(S_0,S,T_0,T)$, wherein $B_{rep}(S_0,S,T_0,T)$ is obtained by taking an intersection of S consecutive rows of $B_{rep}$ starting from row $S_0$ and T consecutive columns starting from column $T_0$, where $S_0$, S, $T_0$, and T are integers.

23. The method of claim 20, wherein $B_{SC}$ is an entry-wise product of $B_{rep}(S_0,S,T_0,T)$ and $W_{base}$, where $S_0$, S, $T_0$, and T are integers.

24. The method of claim 20, wherein replacing entries of the binary SC QC LDPC to obtain the non-binary SC QC LDPC code comprises multiplying each $i^{th}$ set of q−1 columns in $H_{SC,QC}$ by $\beta^i$, wherein $\beta$ is a primitive element in the finite field GF(q), where $q=2^P$, where $S_0$, S, $T_0$, and T are integers.

25. The method of claim 20, wherein $W_{base}$ is based on unwrapping a protograph of an irregular LDPC code, wherein the protograph matrix is decomposed into n matrices, wherein n is an integer greater than or equal to a largest number in the protograph matrix, the decomposed matrices sum to the protograph matrix so that masking a sub-matrix of $B_{rep}$ using $W_{base}$ yields an irregular SC QC LDPC code.

26. The method of claim 25, further comprising assigning finite field elements to $H_{SC,QC}$, for each column of Circulant Permutation Matrices (CPMs) or Zero Matrices (ZMs) in $H_{SC,QC}$, by replacing each 1-component in the column with a non-zero element selected from $GF(2^P)$, where P is an integer.

27. The method of claim 26, wherein the non-zero element selected from $GF(2^P)$ is a non-zero element selected randomly from $GF(2^P)$.

28. The method of claim 20, further comprising:

generating a signal in accordance with the SC QC LDPC code, where the signal includes a Hybrid Automatic Repeat reQuest (HARD) signal, and transmitting the generated signal, by one of wireless, wired, and fiber-optic transmission.

29. A mobile system that supports hybrid automatic repeat request (HARD) transmission configured to generate an algebraic, Spatially-Coupled Low-Density Parity Check (SC LDPC) code and transmitting a signal generated therefrom, comprising:

an LDPC block code selector;

a parity-check matrix generator connected to an output of the LDPC block code selector and configured to generate a non-diagonal parity-check matrix;

an array generator connected to an output of the parity check matrix generator;

a mask matrix generator connected to an output of the array generator configured to select a step size c of a matrix of L matrices to be spatially coupled and one or more of a length a and a width b of the matrix of the L matrices, wherein a masking matrix W has a different rate than an LDPC block code, and wherein a, b, c, and L are integers;

a masker and SC LDPC code generator connected to an output of the mask matrix generator; and a signal generator/transmitter connected to the masker and SC LDPC code generator and configured to generate a signal based on an SC LDPC code generated by the SC LDCP code generator and transmit the signal.

30. A non-transitory computer-readable recording medium including a program for a mobile system that supports hybrid automatic repeat request (HARQ) transmission configured to construct a parity check matrix $H_{SC}$ of an algebraic, binary, Spatially-Coupled Low-Density Parity Check (SC LDPC) code, the program, when executed by a computer, causes the computer to perform a method, the method comprising:

constructing, by a parity-check matrix generator, a non-diagonal LDPC block code parity check matrix H with girth at least 6 by arranging preselected smaller matrices over a finite field GF(q), where q is an integer;

replicating, by an array generator connected to an output of the parity check matrix generator, H a predetermined number of times to form a two-dimensional array $H_{rep}$;

constructing, by a mask matrix generator connected to an output of the array generator, a band-diagonal masking matrix W with a predetermined spatially-coupled pattern based on selecting a step size c of a matrix of L matrices to be spatially coupled and one or more of a length a and a width b of the matrix of the L matrices, wherein the masking matrix W has a different rate than the LDPC block code, and wherein a, b, c, and L are integers;

masking, by a masker and SC LDPC code generator connected to an output of the mask matrix generator, a sub-matrix of $H_{rep}$ using W to obtain the spatially-coupled parity-check matrix $H_{SC}$;

generating a signal based on the spatially-coupled parity-check matrix $H_{SC}$; and transmitting the signal.

* * * * *